(12) United States Patent
Vernenker et al.

(10) Patent No.: US 7,307,912 B1
(45) Date of Patent: Dec. 11, 2007

(54) VARIABLE DATA WIDTH MEMORY SYSTEMS AND METHODS

(75) Inventors: Hemanshu T. Vernenker, Austin, TX (US); Margaret C. Tait, Austin, TX (US); Christopher Hume, Austin, TX (US); Nhon Nguyen, Austin, TX (US); Allen White, Austin, TX (US); Tim Swensen, Mountain View, CA (US); Sam Tsai, Milpitas, CA (US); Steve Eplett, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 174 days.

(21) Appl. No.: 10/974,453

(22) Filed: Oct. 25, 2004

(51) Int. Cl.
G11C 8/00 (2006.01)
G11C 7/00 (2006.01)
G11C 11/00 (2006.01)
G11C 7/10 (2006.01)
G11C 7/02 (2006.01)
G06F 13/00 (2006.01)

(52) U.S. Cl. ............ 365/230.05; 365/220; 365/230.03; 365/230.06; 365/230.08; 365/154; 365/189.02; 365/196; 365/207; 711/131; 711/149

(58) Field of Classification Search ........... 365/230.05, 365/220, 200, 154; 711/131, 149
See application file for complete search history.

(56) References Cited

U.S. PATENT DOCUMENTS

| 5,329,630 | A | * | 7/1994 | Baldwin | ...................... 711/173 |
| 6,127,843 | A | * | 10/2000 | Agrawal et al. | .............. 326/40 |
| 6,473,357 | B1 | * | 10/2002 | Fan et al. | .............. 365/230.05 |
| 6,560,669 | B1 | | 5/2003 | Ryan | |
| 6,571,327 | B1 | | 5/2003 | Wertheizer et al. | |
| 6,661,733 | B1 | | 12/2003 | Pan et al. | |
| 6,765,408 | B2 | * | 7/2004 | Cheng et al. | .................. 326/41 |
| 6,999,372 | B2 | * | 2/2006 | Takayanagi | ............ 365/230.05 |
| 2002/0006072 | A1 | * | 1/2002 | Kunikiyo | ............... 365/230.05 |

* cited by examiner

*Primary Examiner*—Ly Duy Pham
(74) *Attorney, Agent, or Firm*—MacPherson Kwok Chen & Heid LLP; Greg J. Michelson

(57) ABSTRACT

Systems and methods disclosed herein provide for variable data width memory. For example, in accordance with an embodiment of the present invention, a technique for doubling a width of a memory is disclosed, without having to increase a width of the internal data path or the number of input/output pads.

19 Claims, 8 Drawing Sheets

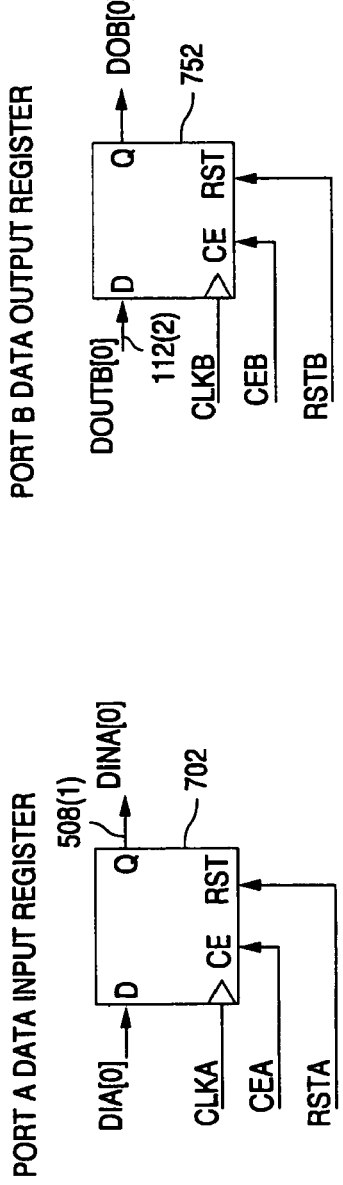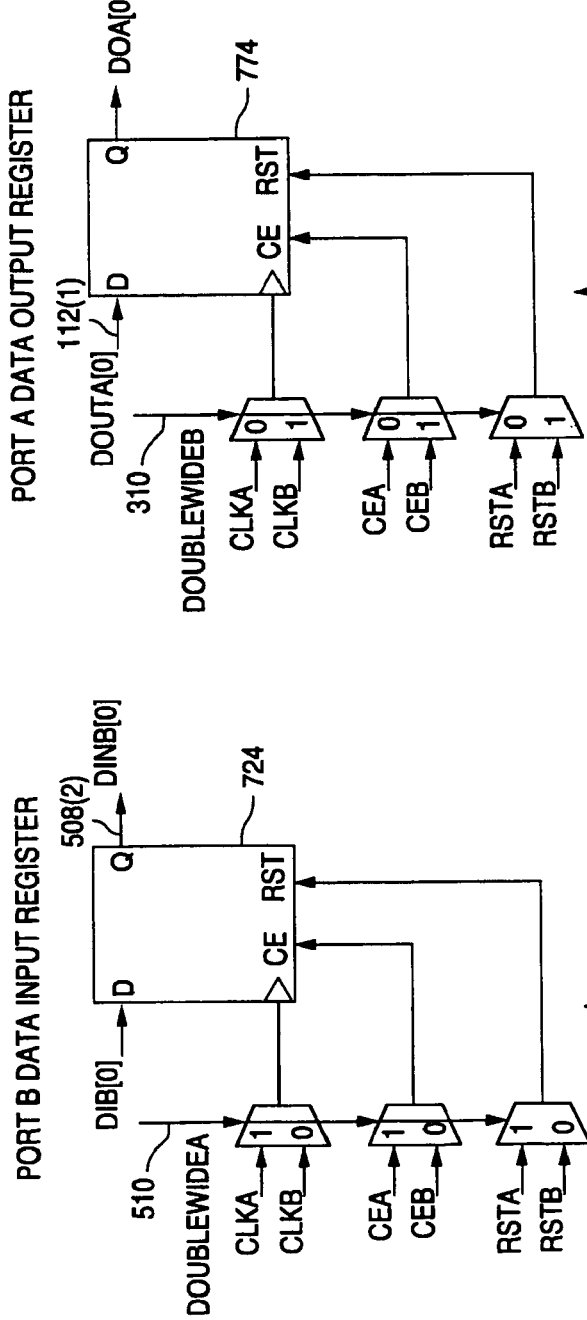
FIG. 7a
FIG. 7b

VARIABLE DATA WIDTH MEMORY SYSTEMS AND METHODS

TECHNICAL FIELD

The present invention relates generally to electrical circuits and, more particularly, to memory having variable data widths.

BACKGROUND

As technology progresses, semiconductor memory applications are requiring faster, larger, and wider memory implementations. A maximum data width of a memory may be determined by a memory array size and a width of an internal data path. Thus, to increase a data width of a memory, a width of the internal data path and the number of input/output pins are typically increased, which results in additional circuitry to support the increased width (e.g., additional input/output registers, sense amplifiers, and other read column circuitry along with write drivers and other write column circuitry). The additional circuitry may substantially increase the required die area and power consumption and may degrade memory performance (e.g., when the memory is configured in a narrower data width configuration).

An alternative method for increasing data throughput for a memory is to read/write data on a rising and a falling edge of a clock signal (e.g., as in double data rate (DDR) memories). However, a substantial amount of complex circuitry is often required to support double data rate operations and the read/write of the data from/to the memory generally must be performed on both the rising and the falling edges of the clock signal. As a result, there is a need for improved memory techniques.

SUMMARY

Systems and methods are disclosed herein for variable data width memory. For example, in accordance with an embodiment of the present invention, a technique for doubling a width of a memory is disclosed. The technique, for example, may be applied to a configurable memory operating in a pseudo-dual port mode, without having to increase a width of an internal data path or the number of input/output pads. Furthermore, for the configurable memory, any die area increase and memory performance impact on existing modes may be minimal as compared to conventional memory techniques.

More specifically, in accordance with one embodiment of the present invention, an integrated circuit includes a memory array having a first and a second port; and a first and a second read circuit corresponding to the first and second port, wherein the first read circuit is adapted to receive bitline signals associated with the first port and the second port, while the second read circuit is adapted to receive bitline signals associated with the second port, the first circuit further adapted to receive a control signal, which determines if the first read circuit is utilized to increase an output data width from the memory array for the second port.

In accordance with another embodiment of the present invention, an integrated circuit includes a memory array having a first and a second write port; a first write circuit coupled to the first write port and adapted to receive a first input signal and provide the first input signal to the memory array; and a second write circuit coupled to the second write port and adapted to receive a second input signal, the first input signal, and a first control signal, wherein the first control signal determines whether the second write circuit provides the second input signal or the first and second input signal through the second write port to the memory array.

In accordance with another embodiment of the present invention, a method of doubling a data width of a memory having multiple ports each adapted to read and write data to the memory is disclosed. The method includes designating a first port a write port and a second port a read port; receiving input signals associated with the first port and the second port; and writing the input signals associated with the first port and the second port to the memory array through the first port. The method may further include receiving bitline signals from the memory that are associated with the first port and the second port; and providing output signals based on the bitline signals associated with the second port through the first port and the second port.

In accordance with another embodiment of the present invention, an integrated circuit includes a memory array; a first port adapted to read data from and write data to the memory array; and a second port adapted to read data from and write data to the memory array, wherein the first port is further adapted to write data associated with the second port through the first port, while the second port is further adapted to utilize the first port to read data associated with the second port.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 7a and 7b show block diagrams illustrating input and output registers of a memory in accordance with an embodiment of the present invention.

Embodiments of the present invention and their advantages are best understood by referring to the detailed

DETAILED DESCRIPTION

In accordance with one or more embodiments of the present invention, techniques for doubling a data width of a memory are disclosed. For example, in a memory having a pseudo-dual port mode, one of the ports (e.g., Port A) may be designated as a write port, while the other port (e.g., Port B) may be designated as a read port. Consequently, during a pseudo-dual port operation, read circuitry associated with Port A (e.g., output data pins, sense amplifiers, and multiplexers) and write circuitry associated with Port B (e.g., input data pins, write drivers, and demultiplexers) are generally not utilized. The data width of the memory during the pseudo-dual port mode may be doubled, therefore, by having Port B utilize the read circuitry from Port A when performing a read operation and by having Port A utilize the write circuitry from Port B when performing a write operation. The width of the data path is then doubled during the pseudo-dual port mode without adding any significant amount of additional circuitry to the memory.

Figure 1:
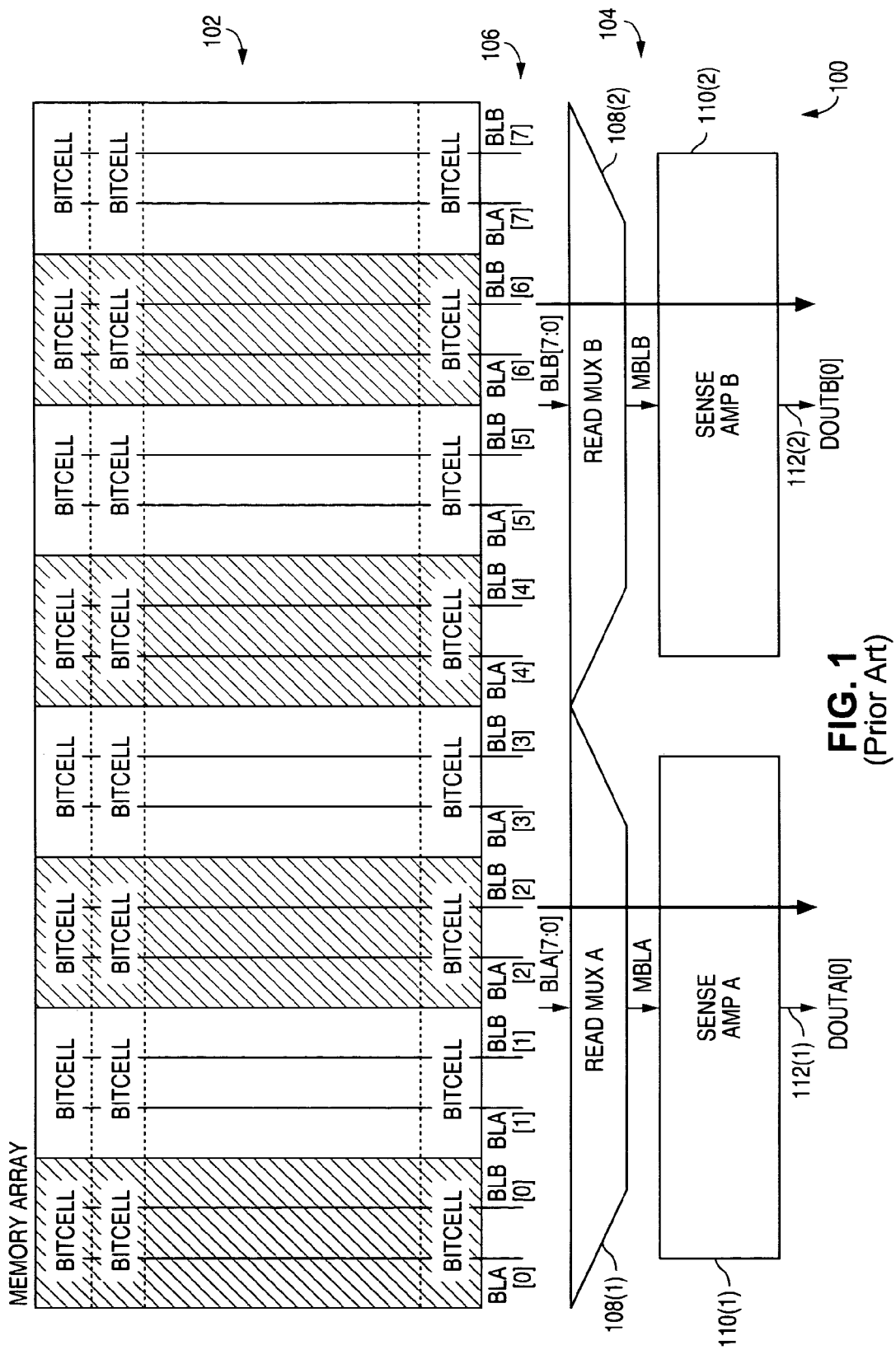
FIG. 1 shows a block diagram illustrating a read path of a conventional memory.

As an example, FIG. 1 shows a block diagram illustrating a memory 100 having a memory array 102 and a read path 104. Memory 100, for example, represents one column of a multiple-column memory having a number of rows. Memory array 102, for example, may be a dual port (e.g., Port A and Port B) static random access memory (SRAM) array with each row in the column having eight dual port SRAM bit cells.

Memory array 102 includes bitlines 106 (labeled BLA[0] through BLA[7] and BLB[0] through BLB[7] corresponding to Port A and B, respectively) that run vertically through memory array 102 (wordlines, not shown in FIG. 1, generally run horizontally through memory array 102). It should be noted that bitlines 106 may represent single ended or complementary pairs of bitlines (e.g., BLA[0] would have a complementary bitline $\overline{BLA}$[0]), but for figure and description clarity, bitlines 106 for this example are shown and described as single ended.

Read path 104 includes read multiplexers 108(1) and 108(2) and sense amplifiers 110(1) and 110(2) that are associated with memory array 102 (for clarity, control signals and other conventional circuitry or signals, such as column address lines, are not shown). For this example as noted above, memory array 102 includes one column (one column wide) and a number of rows, with the column having eight SRAM bit cells per row. In general there would be one of read paths 104 (i.e., read column circuitry) corresponding to each column of memory 100. Furthermore, each port (Port A and Port B) has its own dedicated circuitry, with read multiplexer 108(1) and sense amplifier 110(1) dedicated to Port A and read multiplexer 108(2) and sense amplifier 110(2) dedicated to Port B.

Bitlines 106 from Port A (labeled BLA[7:0]) are routed to read multiplexer 108(1), where one bitline from the set of eight bitlines (BLA[7:0]) is selected via column address lines (not shown) controlling read multiplexer 108(1) to provide an output signal (labeled MBLA). For this example, only one bit can be selected per port per column of memory 100. The output signal (MBLA) is provided to sense amplifier 110(1), which when triggered by appropriate control signals, produces an output signal 112(1) (e.g., a rail-to-rail output signal labeled DOUTA[0]). Port B of read path 104 operates in a similar fashion as described above for Port A and, therefore, the description will not be repeated.

In general, the number of columns in a memory, such as memory 100, depends on a desired data width for the memory and the decoding scheme. For example, in a 1024 by 16 bit memory (i.e., 16,384 bits and a data width of 16 bits), a memory array would include 16 columns to provide 16 corresponding output data bits (i.e., DOUTA[15:0], with one bit from each column). Port A and Port B may each have fourteen address lines, sixteen input data lines, sixteen output data lines, and sixteen read paths (e.g., read paths 104) and write paths along with various control signals.

In this sixteen-column memory example, the larger memory (e.g., the SRAM memory) may be configured into the following six widths and depths: 1) 16,384 by 1, 2) 8,192 by 2, 3) 4,096 by 4, 4) 2,048 by 8, and 5) 1,024 by 16. Port A and Port B may also be configured independently for different widths (e.g., Port A could be configured as 8,192 by 2 while Port B could be configured as 16,384 by 1).

Figure 2:
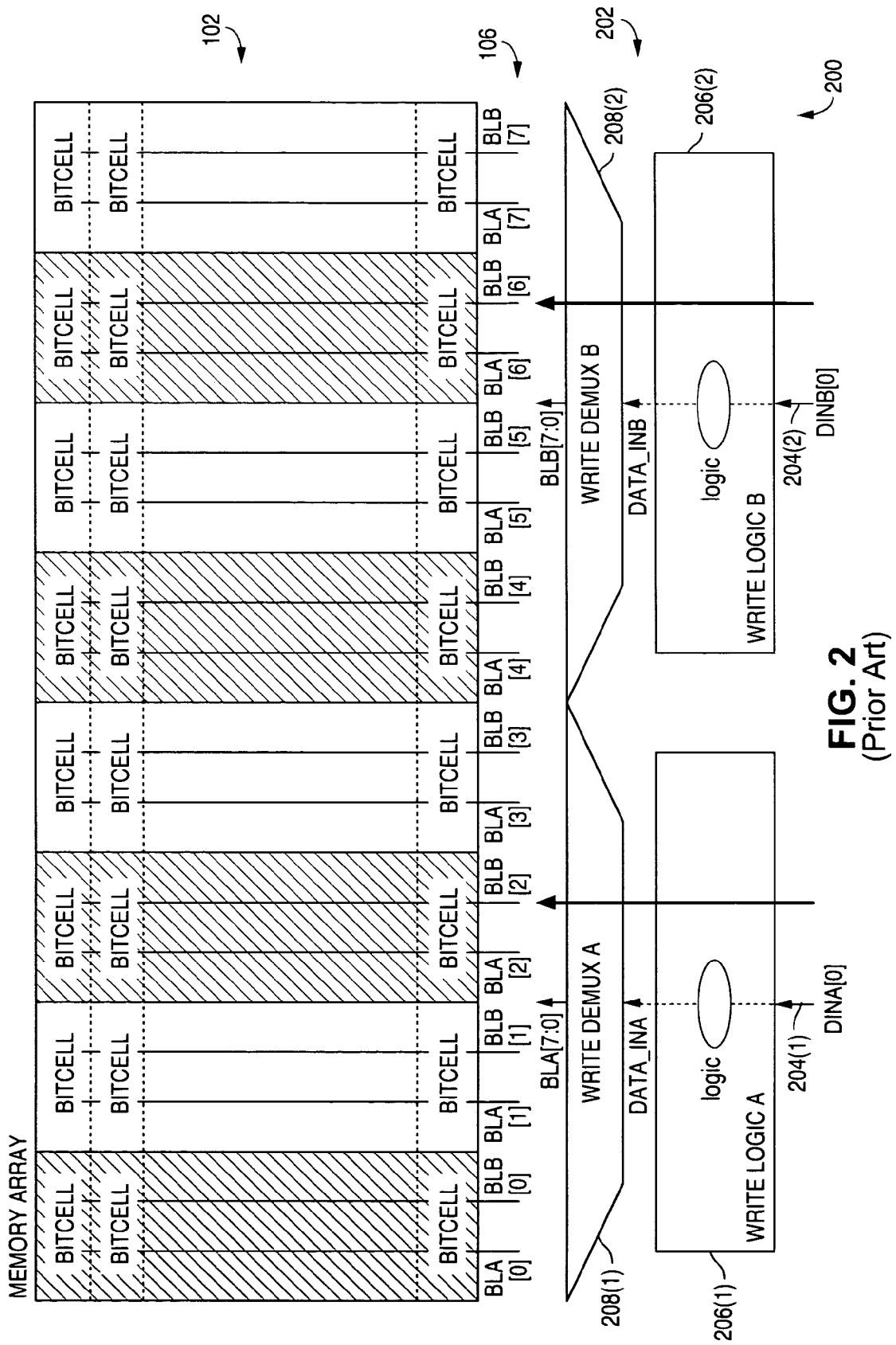
FIG. 2 shows a block diagram illustrating a write path of a conventional memory.

FIG. 2 shows a block diagram illustrating a memory 200 having memory array 102 and a write path 202. Memory 200, for example, may represent memory 100, but illustrates write path 202 for memory array 102 (e.g., one column of dual port SRAM array). In general, for this example, only one bit can be selected per port (e.g., Port A or Port B) per column. Write path 202 includes write logic blocks 206(1) and 206(2) and write demultiplexers 208(1) and 208(2), with write logic block 206(1) and write demultiplexer 208(1) dedicated to Port A and write logic block 206(2) and write demultiplexer 208(2) dedicated to Port B.

For write path 202, for example, an input signal 204(1) (labeled DINA[0]) for Port A is provided to a write logic block 206(1), which comprises decode and control circuitry. Write logic block 206(1) provides an output signal (labeled DATA_INA) to a write demultiplexer 208(1), which routes the output signal (DATA_INA) to one of bitlines 106 (BLA[7:0]) of Port A, depending on the column address signals. Port B of write path 202 operates in a similar fashion as described above for Port A and, therefore, the description will not be repeated.

Memory 100 and memory 200 may represent a memory and illustrate generally read and write circuitry for the memory. However, memory 100 and memory 200 have certain limitations. For example, the data width of the memory (e.g., for Port A or Port B) is limited by its data path width. Furthermore, such as in the pseudo-dual port mode when Port A is utilized as the write port and Port B is utilized as the read port, the read circuitry of Port A and the write circuitry of Port B are not utilized.

Figure 3:
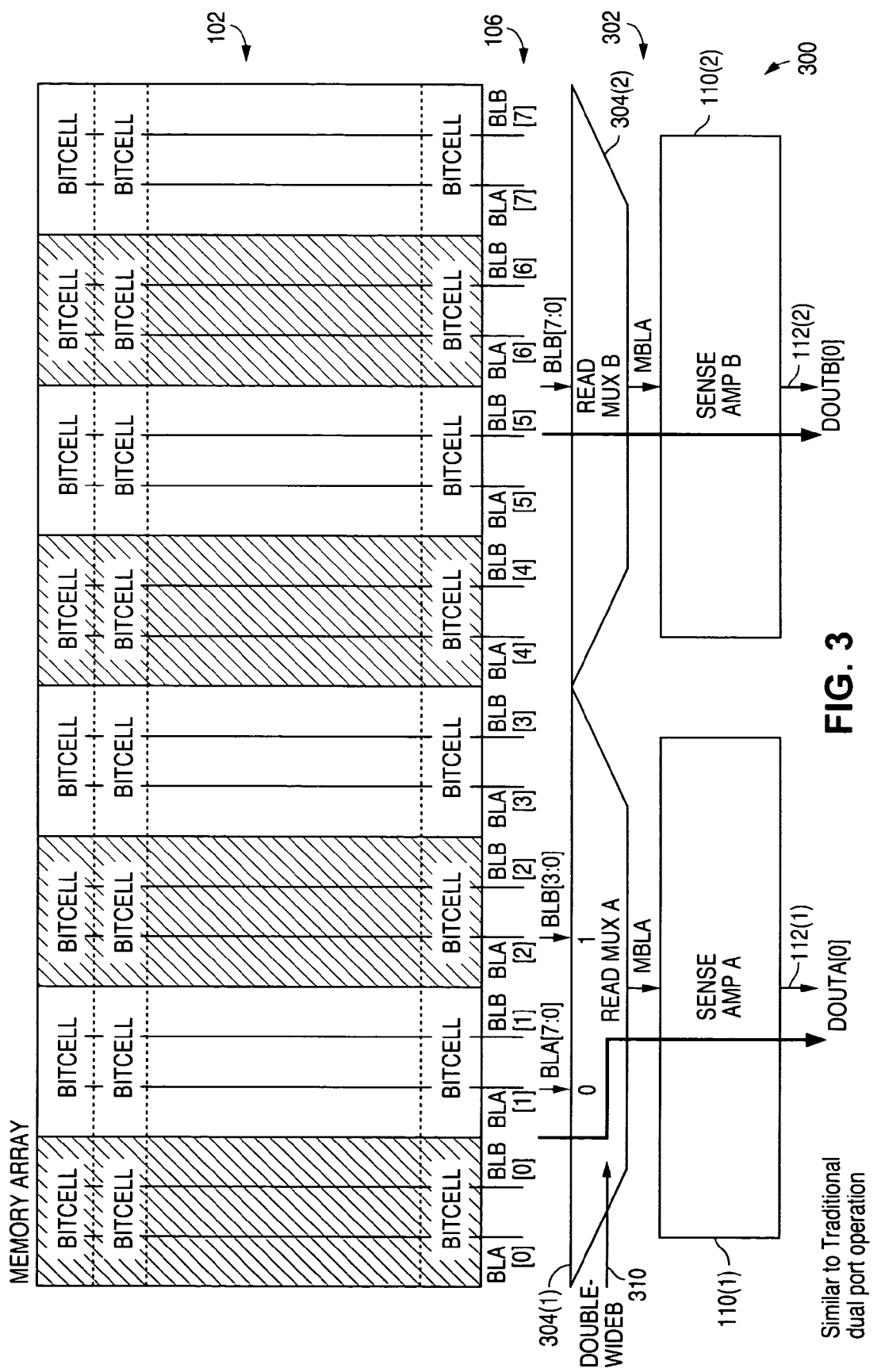
FIG. 3 shows a block diagram illustrating a read path of a memory in accordance with an embodiment of the present invention.

In accordance with one or more embodiments of the present invention, memory techniques are disclosed that address one or more of these limitations. For example, FIG. 3 shows a block diagram illustrating a memory 300 having memory array 102 and a read path 302 in accordance with an embodiment of the present invention. Memory 300, similar to memory 100, may for example represent one column (e.g., of a multiple-column memory) having a number of rows.

Memory 300, like memory 100, can also be configured as single port, pseudo dual port, and true dual port SRAM memory. However, it should be understood that this example is not limiting and the techniques disclosed herein may be applied to a variety of memory types (e.g., dynamic random access memory (DRAM)), memory sizes (e.g., 18 Kb, 36 Kb, or 1 Mb), memory functions (e.g., first in first out (FIFO) or double data rate (DDR)), memory port types (e.g., single port, dual port, or pseudo dual port), and configurations (e.g., various width and depth memory configurations).

Memory 300, as an example, may illustrate a portion of a larger memory (e.g., one column of a larger memory) or be implemented as any memory size desired, as discussed herein for memory 100 (FIG. 1). For example, the larger memory may be a 16,384 bit (16 kb) dual port static random access memory (SRAM) having Ports A and Port B.

For the pseudo dual port mode, Port A may be designated as the write port and Port B may be designated as the read port. For configurations wider than the internal data path (e.g., a 512 by 32 configuration for the 16 column memory example), memory 300 may be utilized in pseudo dual port mode, but not in true dual port mode due to the data path limitations (e.g., the input and output data lines being less than the data width desired).

The pseudo dual port mode (or the single port mode) may provide data widths that are wider than the internal data width for either Port A or Port B, in accordance with an embodiment of the present invention, by having Ports A and B share their read/write circuitry. For example, this technique may be implemented by utilizing the read column circuits from Port A (along with the read column circuits of Port B) when performing a read through Port B, and utilizing the write column circuits from Port B (along with the write column circuits of Port A) when performing a write through Port A.

As shown in FIG. 3, read path 302 includes read multiplexers 304(1) and 304(2) and sense amplifiers 110(1) and 110(2) that provide output signals 112(1) and 112(2) (labeled DOUTA[0] and DOUTB[0], respectively) for corresponding Ports A and B. A control signal 310 (labeled DOUBLEWIDEB) determines whether Port B utilizes read multiplexer 304(1) and sense amplifier 110(1) of Port A.

Figure 4:
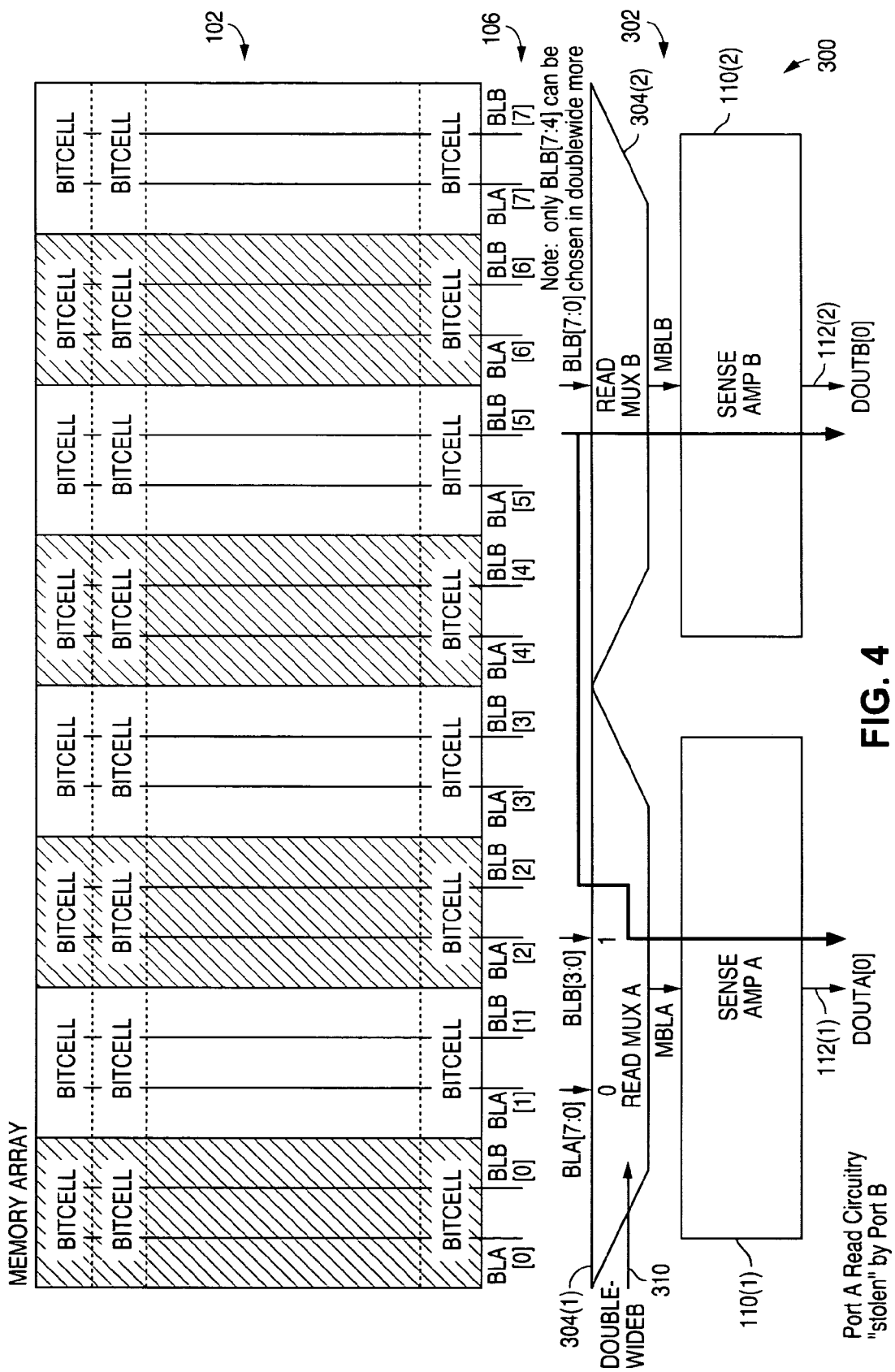
FIG. 4 shows a block diagram illustrating a read path of a memory in accordance with an embodiment of the present invention.

In general, FIG. 3 illustrates memory 300 when control signal 310 is not asserted (e.g., operation similar to conventional memory operation and Port B does not utilize read circuitry of Port A). FIG. 4 illustrates, in accordance with an embodiment of the present invention, memory 300 when control signal 310 is asserted and Port B utilizes read circuitry of Port A (bold arrows illustrate generally data flow through read path 302 of Port A).

Specifically, referring to FIG. 3, read multiplexer 304(1) receives bitlines 106 of Port A (bitlines labeled BLA[0] through BLA[7] or BLA[7:0]), but also receives bitlines 106 of Port B (bitlines labeled BLB[3:0]). Control signal 310 determines whether bitlines from Port A (BLA[7:0]) or Port B (BLB[3:0]) will be selected by read multiplexer 304(1).

In general, for this example, only one bit can be selected per port per column. The output signal (MBLA) from read multiplexer 304(1) is provided to sense amplifier 110(1). In FIG. 3, the data path for Port A is illustrated by a bold arrow to show that control signal 310 is not asserted (e.g., DOUBLEWIDEB=0) and only data from Port A bitlines are routed through read multiplexer 304(1). Consequently, read multiplexer 304(1), with control signal 310 not asserted, selects one bitline from the set of eight Port A bitlines from bitlines 106 (labeled BLA[7:0]).

Read multiplexer 304(1) does not select a bitline from Port B bitlines from bitlines 106 (labeled BLB[3:0]) when control signal 310 is not asserted. Therefore, in this example, the read operation is similar to that described for memory 100 (e.g., a conventional dual port SRAM), although read multiplexer 304(1) may be larger and marginally slower due to the additional loading. The read operation from Port B through read path 302 is similar to the read operation described for memory 100 and, therefore, the description will not be repeated.

When control signal 310 is asserted, read multiplexer 304(1) of Port A is utilized for one or more of Port B bitlines from bitlines 106. For example, FIG. 4 shows memory 300, in accordance with an embodiment of the present invention, when control signal 310 is asserted. In general for this exemplary implementation, when control signal 310 is asserted, memory 300 can only operate in a pseudo dual port mode with Port A as the write port and Port B as the read port. The data path for Port B is now double the width as compared to a conventional memory, with two bits read through Port B per column (and similarly two bits may be written through Port A per column as described further herein).

Because Port B has only one read multiplexer 304(2) and sense amplifier 110(2) per column, Port B utilizes read multiplexer 304(1) and sense amplifier 110(1) from Port A to provide the second of the two bits. This is possible because when control signal 310 is asserted (i.e., doublewide mode selected), Port A is used as a write port and does not utilize its read circuitry.

Specifically, when control signal 310 is asserted, certain ones of bitlines 106 of Port B (e.g., bitlines labeled BLB[3:0] as shown in FIG. 4) are selectable by read multiplexer 304(1), while certain ones of bitlines 106 of Port B (e.g., bitlines labeled BLB[7:4]) are selectable by read multiplexer 304(2). Consequently, output signal 112(1) (DOUTA[0]) is now used as an output data bit for Port B along with output signal 112(2) (DOUTB[0]) from Port B.

In general, it should be noted that the column addresses and control signals for read multiplexer 304(1) and sense amplifier 110(1) are controlled by Port B column addresses and control signals. As an example, by utilizing the techniques discussed herein, a 1024 by 16 memory array, with 16 columns each similar to the column described for memory 300, the data width may be doubled from 16 to 32 bits without increasing the size of the internal data path and pins.

Figure 5:
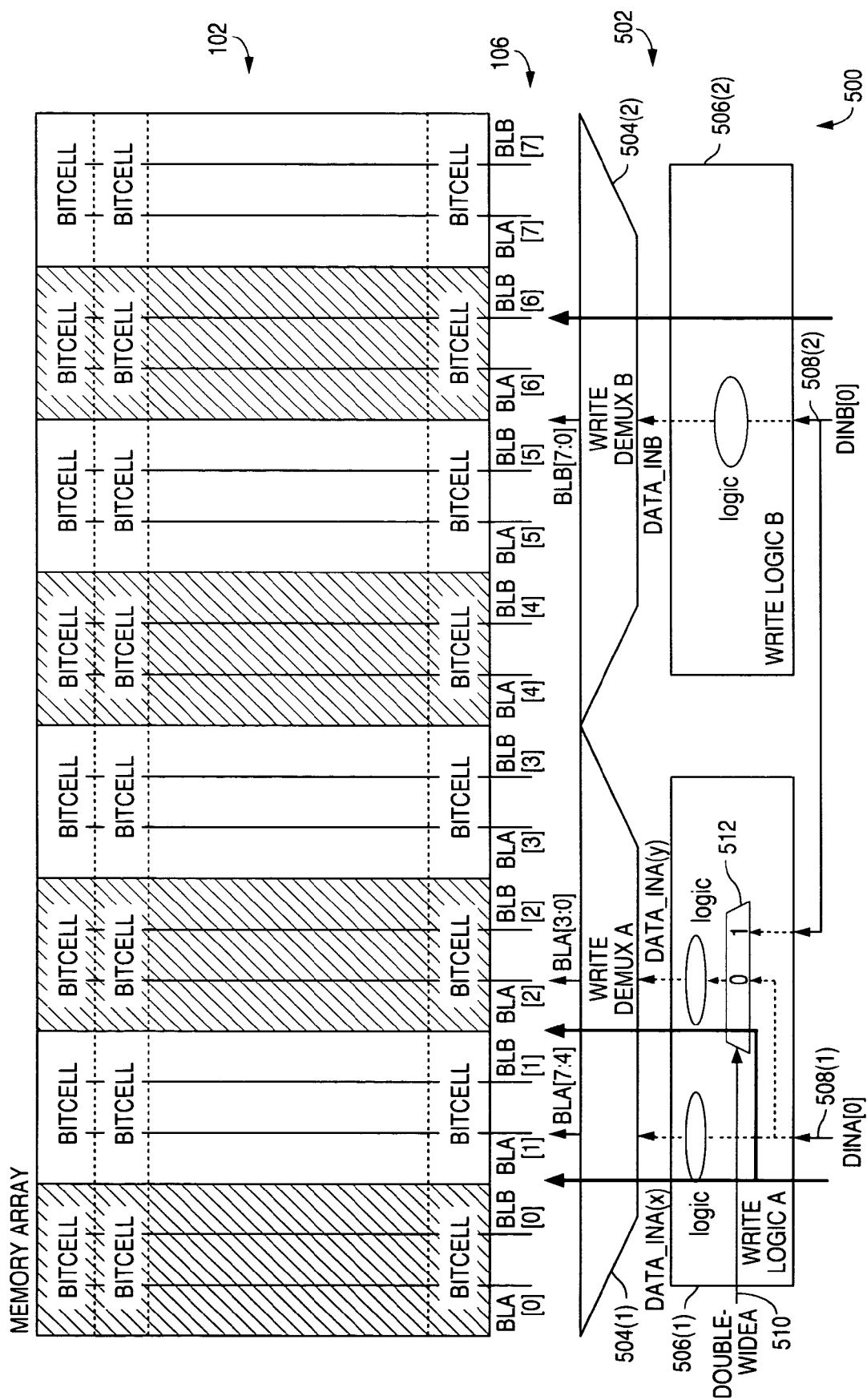
FIG. 5 shows a block diagram illustrating a write path of a memory in accordance with an embodiment of the present invention.

In a similar fashion, memory 300 may share write circuitry between Ports A and B. For example, FIG. 5 shows a block diagram illustrating a memory 500 having a write path 502 for one column in accordance with an embodiment of the present invention. Memory 500 is similar to memory 300, but illustrates write circuitry for one column of a memory, such as memory 300.

Write path 502 of memory 500 includes write demultiplexers 504(1) and 504(2) and write logic 506(1) and 506(2), which receive input signals 508(1) and 508(2) for Port A and Port B, respectively. Additionally, as illustrated in FIG. 5, write logic 506(1) receives input data not only from Port A (input signal 508(1) labeled DINA[0]), but also input data from Port B (input signal 508(2) labeled DINB[0]). A control signal 510 (labeled DOUBLEWIDEA) determines whether the input data from Port A or Port B will be selected.

If control signal 510 is not asserted (e.g., doublewide is disabled or DOUBLEWIDEA=0), the write operation for Port A is similar to the traditional dual port write operation. Consequently, a multiplexer 512 in write logic 506(1) does not select input signal 508(2) (DINB[0]) and, thus, input signal 508(1) (DINA[0]) can be routed onto any of the eight bitlines 106 of Port A (BLA[7:0]). As in the traditional dual port write operation, only one bit can be selected per port per column, with the write operation for Port B similar to the write operation described for memory 100 of FIG. 2.

Figure 6:
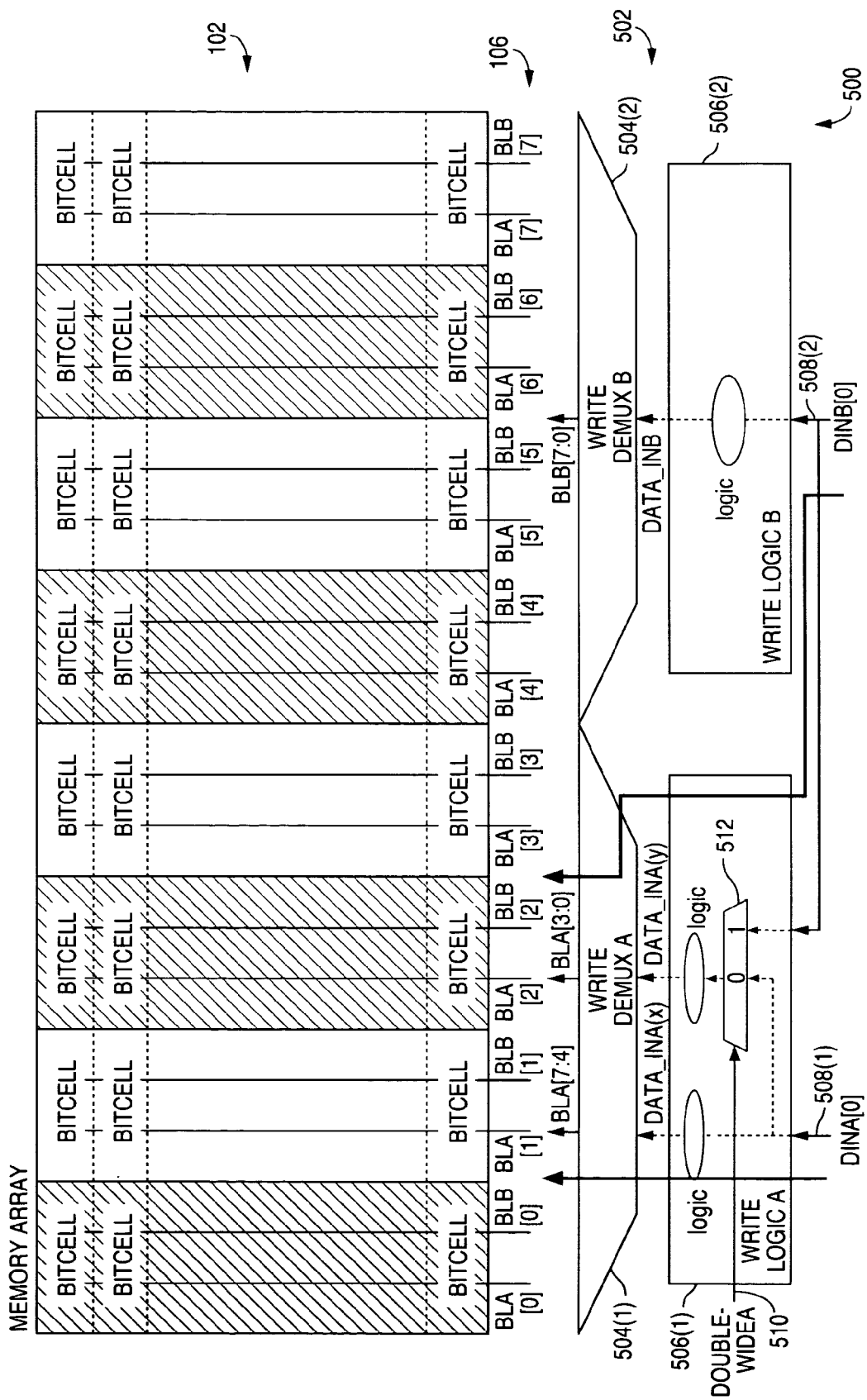
FIG. 6 shows a block diagram illustrating a write path of a memory in accordance with an embodiment of the present invention.

FIG. 6 shows a block diagram illustrating memory 500 with write path 502, in accordance with an embodiment of the present invention, with control signal 510 asserted (e.g., doublewide is enabled or DOUBLEWIDEA=1). When control signal 510 is asserted for this exemplary implementation, memory 500 can only operate in a pseudo-dual port mode with Port A as the write port and Port B as the read port. The data path for Port A is now double the width in the traditional case, and hence two bits are selected for Port A per column.

However, Port A has only one input signal 508(1) (e.g., one input bit DINA[0] per column) and, therefore, to write two bits, Port A utilizes input signal 508(2) (input pin DINB[0]) from Port B. This is possible because in doublewide mode, Port B can only be used as a read port, and therefore, Port B does not require its write input pins and signals. Input signal 508(2) (DINB[0]) is routed through multiplexer 512 in write logic 506(1) (as illustrated in FIG. 6 by the bold arrows) onto Port A bitlines of bitlines 106 (e.g., Port A bitlines labeled BLA[3:0]), while input signal 508(1) (DINA[0]) is routed onto Port A bitlines of bitlines 106 (e.g., Port A bitlines labeled BLA[7:4]).

Therefore, as described herein, it is possible to write one or two bits through one port (e.g., Port A) and into the memory column of memory array 102. For example, for a 1 k by 16 memory array, with 16 columns as described for memory 500, the data width may be doubled from 16 to 32 bits without increasing the size of the internal data path or number of pins. It should also be understood for this exemplary implementation that because Port B may be performing a read operation during a write operation through Port A, Port B bitlines of bitlines 106 may not be utilized for writing data into memory array 102.

FIGS. 7a and 7b show block diagrams illustrating exemplary implementations of input registers 702 and 724 and output registers 752 and 774 for a memory in accordance with an embodiment of the present invention. Input registers 702 and 724 may represent exemplary data input registers for Ports A and B, respectively, of memory 500 for the data input for one column.

Input register 702 (Port A) may be implemented in a similar fashion as a conventional data input register. However, input register 724 (Port B) would utilize additional (e.g., three) multiplexers 726 to accommodate the doublewide mode. Specifically, when Port A is in doublewide mode (control signal 510 asserted), Port B is forced to be only a read port and, as a result, Port B input data bits (e.g., data bit labeled DIB[0] or corresponding input signal 508(2)) are unused for Port B. However, the Port B input data bits may be utilized as data inputs for Port A and, thus, must be controlled by the Port A control signals (clock enable for Port A (CEA) and reset for Port A (RSTA)) and clock (CLKA for Port A) selected by control signal 510 via multiplexers 726.

When the Port A is not in doublewide mode (control signal 510 not asserted), the Port B input data is controlled by its own control signals (clock enable for Port B (CEB) and reset for Port B (RSTB)) and clock (CLKB for Port B), in a similar fashion as in conventional memory (e.g., traditional dual port SRAM). Furthermore, the address and control signal registers for both ports may be generally implemented in a similar fashion as in conventional memory.

Output registers 752 and 774 may represent exemplary data output registers for Ports B and A, respectively, of memory 500 for the data output for one column. Output register 752 (Port B) may be implemented in a similar fashion as a conventional data output register. However, output register 774 (Port A) would utilize additional (e.g., three) multiplexers 776 to accommodate the doublewide mode.

Specifically, when Port B is in doublewide mode (control signal 310 asserted), Port A is forced to be only a write port and, as a result, Port A output data bits (e.g., data bit labeled DOA[0] or corresponding output signal 112(1)) are unused for Port A. However, the Port A output data bits may be utilized as data outputs for Port B and, thus, must be controlled by the Port B control signals (clock enable for Port B (CEB) and reset for Port B (RSTB)) and clock (CLKB for Port B) selected by control signal 310 via multiplexers 776.

When the Port B is not in doublewide mode (control signal 310 not asserted), the Port A output data is controlled by its own control signals (clock enable for Port A (CEA) and reset for Port A (RSTA)) and clock (CLKA for Port A), in a similar fashion as in conventional memory (e.g., traditional dual port SRAM).

Figure 8A:
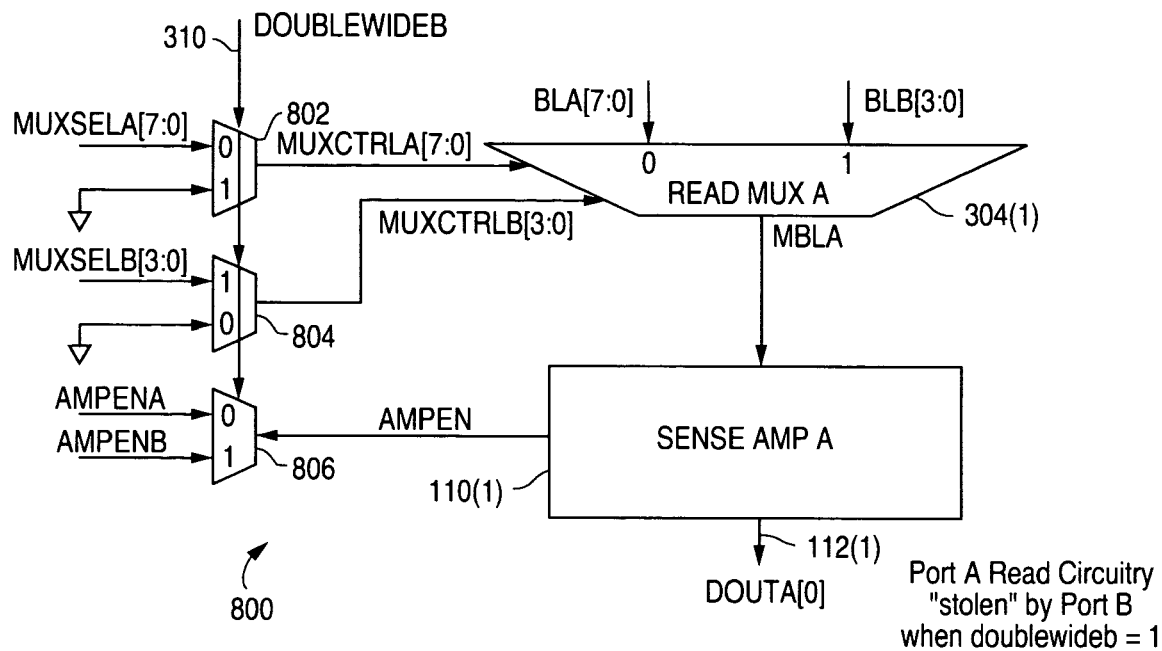
FIGS. 8a and 8b show block diagrams illustrating read circuitry of a memory in accordance with an embodiment of the present invention.
Figure 8B:
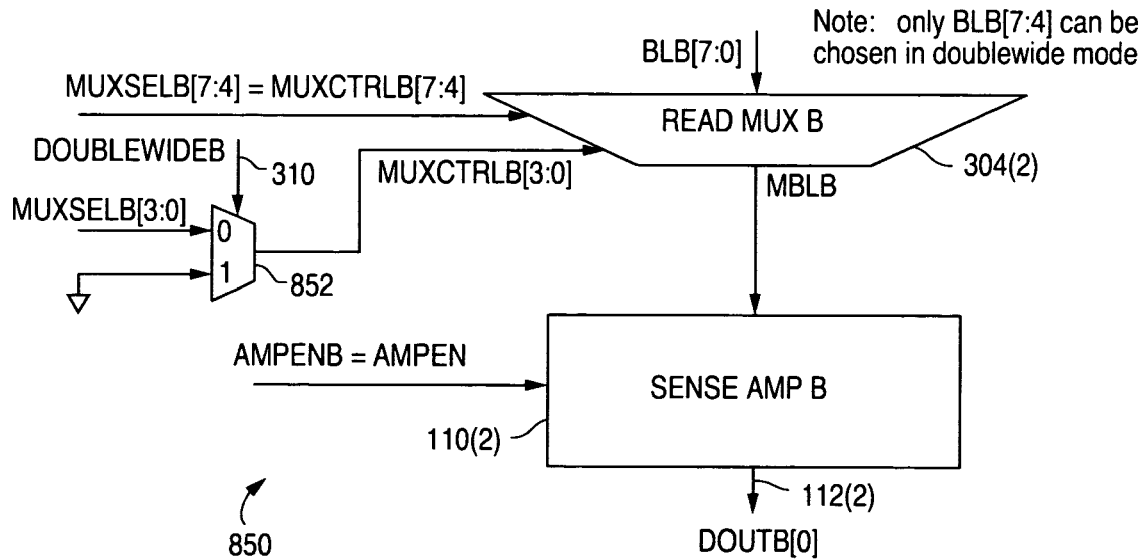

FIGS. 8a and 8b show block diagrams illustrating exemplary implementations of read circuitry 800 and 850 for Ports A and B, respectively, of a memory in accordance with an embodiment of the present invention. For example, read circuitry 800 and 850 may represent exemplary circuitry and control signals for Ports A and B, respectively, of memory 300 (FIG. 3).

Specifically, read circuitry 800 illustrates control signals (labeled MUXSELA[7:0], MUXSELB[3:0], MUXCTRLA [7:0], MUXCTRLB[3:0], AMPENA, AMPENB, and AMPEN) for read multiplexer 304(1) and sense amplifier 110(1). When Port B is in doublewide mode (control signal 310 asserted), Port B utilizes read multiplexer 304(1) and sense amplifier 110(1) (e.g., as discussed in reference to FIG. 4). Therefore, the control signal MUXCTRLB[3:0] for read multiplexer 304(1) is active and must be driven by Port B signals (i.e., the control signal MUXSELB[3:0]) as determined by control signal 310 via a multiplexer 804.

When doublewide mode is enabled for this exemplary implementation, bitlines 106 of Port A (BLA[7:0]) are never selected and, therefore, the control signal MUXCTRLA[7:0] signals are driven low by control signal 310 via a multiplexer 802. In this mode, the value of the control signal AMPEN to sense amplifier 110(1) is determined by the control signal AMPENB of Port B as controlled by control signal 310 via a multiplexer 806.

When Port B is not in doublewide mode (i.e., control signal 310 not asserted), Port A utilizes read multiplexer 304(1) and sense amplifier 110(1) (e.g., as discussed in reference to FIG. 3). Therefore, the control signal MUXCTRLA[7:0] for read multiplexer 304(1) is active and must be driven by Port A signals (i.e., the control signal MUXSELA [7:0]), in a similar fashion as in a conventional memory.

When doublewide mode is not enabled for this exemplary implementation, bitlines 106 of Port B (e.g., BLB[3:0]) are never selected and, therefore, the control signal MUXCTRLB[3:0] is driven low by control signal 310 via multiplexer 804. In this mode, the value of the control signal AMPEN to sense amplifier 110(1) is determined by the control signal AMPENA of Port A as controlled by control signal 310 via multiplexer 806 (e.g., with the read multiplexer and the sense amplifier operating in a similar fashion as in a conventional memory).

Read circuitry 850 illustrates the control signals for read multiplexer 304(2) and sense amplifier 110(2). When Port B is in doublewide mode (control signal 310 asserted) for this exemplary implementation, only certain bitlines 106 of Port B (e.g., bitlines BLB[7:4]) can be selected because bitlines BLB[3:0] of bitlines 106 of Port B are provided to read multiplexer 304(1) and sense amplifier 110(1) of Port A. Thus, only a control signal MUXCTRLB[7:4] is driven by a control signal MUXSELB[7:4], while the control signal MUXCTRLB[3:0] is forced low by control signal 310 via a multiplexer 852.

When Port B is not in doublewide mode (control signal 310 not asserted), any of bitlines 106 of Port B (i.e., bitlines BLB[7:0]) may be selected. Therefore, the control signal MUXCTRLB[7:0] is controlled by the control signal MUXSELB[7:0] (i.e., MUXSELB[7:4] and MUXSELB[3:0]), in a similar fashion as in a conventional memory. In all modes, sense amplifier 110(2) is controlled by the control signal AMPENB.

In general, in accordance with an embodiment of the present invention, a method of doubling the width of the pseudo-dual port mode (or single port mode) in a configurable memory, without increasing the width of the internal data path or the number of input/output pads, is disclosed. In contrast to DDR-types of memories that require read/write of data from/to the memory on both rising and falling edges of the clock, one or more embodiments of the present invention permit a read/write of data on only one edge of the clock during a clock cycle while still increasing data throughput. Alternatively, one or more embodiments may also permit a read/write of data on both edges of the clock during the clock cycle (e.g., by incorporating DDR-type circuit techniques into the embodiment) to greatly increase (e.g., quadruple) the data throughput from/to the memory in a pseudo-dual port mode, with the data being transferred on both rising and falling clock edges.

In accordance with one or more embodiments of the present invention, memory techniques are disclosed that may provide certain advantages over a conventional memory. For example, a wider memory configuration may be provided without increasing the width of the internal data path. Additionally, there may be a savings in terms of power (e.g., because the internal data path is not widened) and minimal performance impact (e.g., such as on other modes of the memory) relative to conventional techniques. Furthermore, there may be no increase in pin requirements (e.g., pinout) because the pins are borrowed from the port that is not utilizing the pins and there may be less die area required because the number of read column circuits and write column circuits are not increased relative to conventional techniques.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a memory array having first and second ports; and
   first and second read circuits corresponding to the first and second ports, wherein the first read circuit is adapted to receive bitline signals associated with the first port and the second port, while the second read circuit is adapted to receive bitline signals associated with the second port, the first read circuit further adapted to receive a control signal, which determines if the first read circuit is utilized to increase an output data width from the memory array for the second port;
   wherein the control signal determines whether the first read circuit routes through at least one of the bitline signals from the second port to increase the output data width for the second port or at least one of the bitline signals from the first port.

2. The integrated circuit of claim 1, wherein the first read circuit is controlled by second control signals associated with the second port when the first read circuit routes through at least one of the bitline signals from the second port.

3. The integrated circuit of claim 1, wherein the first and second read circuits each comprise:
   a read multiplexer; and
   a sense amplifier coupled to the read multiplexer and adapted to provide an output signal.

4. The integrated circuit of claim 1, further comprising:
   a first and a second write circuit corresponding to the first and second port, wherein the first write circuit is adapted to receive input signals associated with the first port and the second port, while the second write circuit is adapted to receive the input signal associated with the second port, the first write circuit further adapted to receive a write control signal, which determines if the first write circuit is utilized to increase an input data width to the memory array for the first port.

5. The integrated circuit of claim 4, wherein the write control signal determines whether the first write circuit routes through the input signal associated with the first port or routes through the input signals associated with the first port and the second port to the first port of the memory array to increase the input data width to the memory array.

6. The integrated circuit of claim 4, wherein the second write circuit is controlled by third control signals associated with the first port when the first write circuit routes through the input signal associated with the second port.

7. The integrated circuit of claim 4, wherein the first and second write circuits each comprise:
   write logic; and
   a write demultiplexer coupled to the write logic.

8. The integrated circuit of claim 4, wherein the memory array comprises a plurality of static random access memory cells arranged in rows and columns and adapted to provide a single port, a pseudo dual port, and a dual port memory mode.

9. An integrated circuit comprising:
   a memory array having first and second ports;
   a first read means for receiving bitline signals on corresponding first port bitlines of the first port and providing a first output signal for the first port; and
   a second read means for receiving a first control signal and bitline signals on the first port bitlines and the second port bitlines of the first port and the second port, respectively, and providing a second output signal based on bitline signals on the first port bitlines of the first port or on the second port bitlines of the second port in response to the first control signal.

10. The integrated circuit of claim 9, further comprising:
    a first write means for receiving a first input signal and providing the first input signal through the first port to the memory array; and
    a second write means for receiving the first input signal, a second input signal, and a second control signal and providing the second input signal or the first and second input signal through the second port to the memory array in response to the second control signal.

11. The integrated circuit of claim 10, wherein the memory array is adapted to provide a pseudo dual port mode, the memory array being further adapted to double a read and a write data width in the pseudo dual port mode by asserting the second control signal to have the second write means provide the first and second input signal to the memory array through the second port and by asserting the first control signal to have the second read means provide the second output signal based on the bitline signals from the first port.

12. The integrated circuit of claim 11, wherein the first read means further provides the first output signal based on the bitline signals from the first port when the memory array is in the pseudo dual port mode.

13. The integrated circuit of claim 9, wherein the memory array comprises a plurality of static random access memory cells arranged in rows and columns and adapted to provide a single port, a pseudo dual port, and a dual port memory mode.

14. A method of doubling a data width of a memory having multiple ports each adapted to read and write data to the memory, the method comprising:
    designating a first port a write port and a second port a read port;
    receiving bitline signals from the memory via bitlines corresponding to the first port and the second port; and
    providing output signals based on the bitline signals provided by bitlines corresponding to the second port through the first port and the second port in response to a first control signal.

15. The method of claim 14, further comprising:
    receiving input signals associated with the first port and the second port; and
    writing the input signals associated with the first port and the second port to the memory through the first port in response to a second control signal.

16. The method of claim 14, wherein the second port utilizes read circuitry of the first port to provide one of the output signals based on the bitline signals associated with the second port.

17. The method of claim 14, wherein the memory is adapted to provide a single port, a pseudo dual port mode, and a dual port mode.

18. The method of claim 14, wherein the memory comprises a plurality of static random access memory cells arranged in rows and columns.

19. An integrated circuit comprising:
    a memory array;
    a first port adapted to read data from and write data to the memory array; and
    a second port adapted to read data from and write data to the memory array, wherein the first port is further adapted to write data associated with the second port through the first port in response to a first control signal, and wherein the second port is further adapted to utilize the first port to read data associated with the second port in response to a second control signal.

* * * * *